US009055382B2

(12) United States Patent
Lane

(10) Patent No.: US 9,055,382 B2
(45) Date of Patent: Jun. 9, 2015

(54) CALIBRATION OF HEADPHONES TO IMPROVE ACCURACY OF RECORDED AUDIO CONTENT

(76) Inventor: Richard Lane, Southport, CT (US)

( * ) Notice: Subject to any disclaimer, the term of this patent is extended or adjusted under 35 U.S.C. 154(b) by 1010 days.

(21) Appl. No.: 13/171,695

(22) Filed: Jun. 29, 2011

(65) Prior Publication Data

US 2013/0003981 A1 Jan. 3, 2013

(51) Int. Cl.

| | |
|---|---|
| ***H03G 5/00*** | (2006.01) |
| ***H04R 29/00*** | (2006.01) |
| ***H04R 1/10*** | (2006.01) |
| ***H04B 15/00*** | (2006.01) |
| ***H04S 7/00*** | (2006.01) |

(52) U.S. Cl.

CPC ............... *H04S 7/301* (2013.01); *H04R 29/004* (2013.01); *H04S 7/304* (2013.01); *H04S 2400/15* (2013.01); *H04S 2420/01* (2013.01)

(58) Field of Classification Search

CPC ............ H04R 3/04; H04R 3/002; H03G 5/18; H03G 5/04

USPC ....................... 381/94.9, 56, 58, 74, 101, 103

See application file for complete search history.

(56) References Cited

U.S. PATENT DOCUMENTS

| | | | | |
|---|---|---|---|---|
| 3,617,647 | A * | 11/1971 | Maier et al. | 369/5 |
| 3,985,960 | A | 10/1976 | Wallace, Jr. | |
| 4,088,849 | A | 5/1978 | Usami et al. | |
| 4,143,244 | A | 3/1979 | Iwahara et al. | |
| 4,388,494 | A | 6/1983 | Schöne et al. | |
| 4,992,966 | A | 2/1991 | Widin et al. | |
| 5,881,103 | A | 3/1999 | Wong et al. | |
| 6,801,627 | B1 | 10/2004 | Kobayashi | |
| 7,012,630 | B2 | 3/2006 | Curry et al. | |
| 7,065,219 | B1 | 6/2006 | Abe et al. | |
| 7,283,635 | B1 | 10/2007 | Anderson et al. | |
| 7,333,622 | B2 | 2/2008 | Algazi et al. | |
| 2006/0245305 | A1 | 11/2006 | Aarts et al. | |
| 2010/0322431 | A1 | 12/2010 | Lokki et al. | |
| 2011/0002471 | A1 * | 1/2011 | Wihardja et al. | 381/56 |

OTHER PUBLICATIONS

Welcome to David Griesinger's home page! 26 pages, Last Update Jul. 25, 2011: <URL: http://www.davidgriesinger.com/>.

D. Griesinger, "Binaural Techniques for Music Reproduction" Presented at the 8$^{th}$ International conference of the AES, May 3-6 Washington, D.C., 21 pages, May 1990.

D. Griesinger, "Frequency response adaptation in binaural hearing", 33 pages: <URL: http://www.DavidGriesinger.com/>, May 2009.

* cited by examiner

*Primary Examiner* — Vivian Chin

*Assistant Examiner* — Douglas Suthers

(74) *Attorney, Agent, or Firm* — Lipsitz & McAllister, LLC

(57) ABSTRACT

User headphones are calibrated in real time to improve the reproduction accuracy of recorded audio content. Microphones of a type used to record the audio content (including their orientation and recording characteristics) are characterized to indicate a first audio coloration. Audio playback devices of a type used to process the audio content are characterized to indicate a second audio coloration. Headphones of a type corresponding to the user headphones are characterized to indicate a third audio coloration. An equalization signal is computed based on the audio colorations, and is applied to calibrate the user headphones during playback of the audio content. A database of the characterizations is maintained so that calibration of different models of headphones using different playback devices can be accomplished for audio content recorded using different models of microphones.

18 Claims, 3 Drawing Sheets

CALIBRATION OF HEADPHONES TO IMPROVE ACCURACY OF RECORDED AUDIO CONTENT

The present invention relates to the reproduction of sound via headphones, and more particularly to methods and apparatus for recreating the acoustic environment of a listener at an audio event when the event is recorded and played back through headphones.

BACKGROUND OF THE INVENTION

Apparatus and techniques for the faithful reproduction of sound have been the subject of a great deal of development effort. The benefits of high-quality sound reproduction include increased listening pleasure of musical compositions and multimedia presentations, movies, television shows and the like. More realistic sound reproduction is also desirable in order to provide increased intelligibility of oral communications under difficult circumstances, e.g., for public speakers located in extremely noisy environments.

Despite many attempts throughout the years and various advances in both analog and digital audio technology, complete audio accuracy has still not been achieved with existing sound reproduction systems. Audiophiles and others are continually striving to achieve sound reproduction which, in effect, places the listener in the audience. This goal has been elusive, although many improvements have been made in recent years that are providing listeners with more realistic audio experiences. In spite of recent advancements, there is still room for improvement.

One known stereophonic system attempts to produce electrical signals which faithfully represent what a person actually located in the sound field of interest would hear by utilizing microphones positioned to duplicate the human ears. In some instances, the microphones have been actually placed on or encased in a mannequin or model of a head in an attempt to capture the sound as it is actually heard by a physically present listener, influenced by head and ear size, bone construction, and other factors. If the signal recorded by such a system is reproduced in a quality stereo apparatus and presented to the listener by means of a stereophonic headset, a marked improvement in directionality is observed. In particular, the listener's ability to determine the relative location of each particular sound source contributing to the overall recorded sound field is enhanced. This improvement in directionality, in turn, imparts the sensation of greater realism. For example, where the reproduced sound is musical entertainment, the listener's sense of impression as to the localization of each musical instrument and each voice is greatly improved. When the reproduced sound is speech in which there is either a high background noise level or several speakers engaging in rapid conversational exchange, the listener's ability to ascertain what is said by a speaker is significantly enhanced. Although this prior art system has demonstrated improved directionality and realism, it has not achieved that degree of improvement over more conventional recording and reproduction systems required to create widespread interest and application.

Another prior art system, described in U.S. Pat. No. 3,985,960 to Wallace, Jr. provides a binaural sound recording and reproduction system that utilizes a recording mannequin (dummy) equipped with an electroacoustic model of the human auditory tract to record the sound pressure that would be exerted on a listener's eardrum. This system also utilizes a headset with in-ear transducers or receivers that exhibit a flat frequency response as measured at the listener's eardrums.

The receiver units utilize acoustic impedance matching to the listener's ear canal to effect a flat frequency response characteristic. An equalizer circuit is provided to facilitate the use of the in-ear receivers with conventionally recorded sound.

The primary purpose of these recording technologies, from binaural to multi-channel is to try to engineer recordings to simulate the original environment when the recordings are played back, e.g., through headphones. There are also headphone systems that attempt to recreate a live environment, similar to the way multi-channel surround systems do for speakers. In all of these systems known to date, there are nagging differences between what the human listener actually hears and what a "proxy device" can attempt to recreate through technology. To date, there has been no connection between how something is recorded and how the recording is played back by the user.

It would be advantageous to tie together the recording technology or technologies used to make a recording with the playback mechanisms used by the listener. It would be particularly advantageous to eliminate as many variables as possible that exist in the various choices in playback devices (e.g., mp3 players, smart phones, computers, tablets, etc.) used by the listener as well as the headphones used to reproduce the audio content. It would be still further advantageous to provide one or more databases of recording technologies (e.g., microphones, recorders, etc.) and their effect upon the original acoustic environment in which audio content is created, the playback mechanism chosen by the user and its potential changes to the playback signal, and the headphone type (e.g., brand and model number) used by the user to listen to the audio content. It would also be advantageous to use this information stored in the database(s) during the reproduction of the audio content to provide an equalization signal ("EQ signal"), and to use the equalization signal to calibrate the headphones for an improved and more accurate listening experience.

The present invention provides methods and apparatus having the aforementioned and other advantages. Moreover, the unique combination of components/techniques disclosed herein provides various improvements over previously known structures and techniques.

SUMMARY OF THE INVENTION

In accordance with the invention, a method is provided for calibrating user headphones to improve the accuracy of recorded audio content reproduced thereon. Reference microphones of a type used to record the audio content are characterized to indicate a first audio coloration caused by the microphones when located proximate to a listener's ears. The microphones are also characterized to indicate a second audio coloration caused thereby when located proximate to the ears of a dummy head. Reference headphones of a type corresponding to the user headphones are characterized to indicate a third audio coloration caused by the reference headphones when used to reproduce audio content. An equalization signal $\Delta E$ is computed based on the first, second and third audio colorations. The equalization signal is applied to calibrate the user headphones during playback of audio content recorded using microphones of a type corresponding to the reference microphones.

The first coloration can be determined by using the microphones proximate to the listener's ears to sample test tones, and then measuring a difference between the actual test tones and the test tones at an output of the microphones proximate to the listener's ears to obtain a first difference signal $\Delta A$.

The second coloration can be determined by using the microphones proximate to the ears of the dummy head to sample test tones, and measuring a difference between the actual test tones and the test tones at the output of the microphones proximate to the ears of the dummy head to obtain a second difference signal ΔB.

The third coloration can be determined by playing test tones through the headphones, and measuring a difference between the actual test tones and the reproduction of the test tones by the headphones to obtain a third difference signal ΔC.

The equalization signal ΔE can be obtained by adding ΔA+ΔB+ΔC.

A database of equalization parameters indicative of the audio colorations can be maintained. The equalization parameters are used to compute equalization signals to calibrate different makes and models of headphones. In a preferred embodiment, one or more databases are maintained containing data for characterized reference microphones, characterized reference headphones, and equalization parameters associated with the different microphones and headphones. A listener can then identify a particular set of headphones being used to listen to audio content, and a headphone identifier will be provided (e.g., from the one or more databases) in response thereto. A microphone identifier can be extracted from the audio content to identify the type of microphones used to record the audio content. Equalization parameters can then be retrieved from the database in response to the headphone identifier and the microphone identifier for use in computing equalization signals to calibrate the listener's headphones.

A database of playback devices can also be provided. This may be a separate database or one of the previously mentioned one or more databases. Similarly, a database of equalization parameters associated with the playback devices is maintained. The listener can identify a particular playback device being used to listen to audio content, and a playback device identifier can be provided in response thereto. An equalization parameter can then be retrieved from the database in response to the playback device identifier and incorporated into the equalization signal for use in calibrating the listener's headphones.

Apparatus is provided for calibrating user headphones to improve the accuracy of recorded audio content reproduced thereon. The apparatus includes means for characterizing reference microphones of a type used to record the audio content to indicate a first audio coloration caused by the microphones when located proximate to a listener's ears. Means are also provided for characterizing the microphones to indicate a second audio coloration caused thereby when located proximate to the ears of a dummy head. In addition, means are provided for characterizing reference headphones of a type corresponding to the user headphones to indicate a third audio coloration caused by the reference headphones when used to reproduce audio content. A processor is coupled to receive parameters indicative of the first, second and third audio colorations, and to compute an equalization signal ΔE based on the colorations. Means are provided for applying the equalization signal to calibrate the user headphones during playback of audio content that was recorded using microphones of a type corresponding to the reference microphones.

The apparatus can determine the first coloration by using the microphones proximate to the listener's ears to sample test tones, and measuring a difference between the actual test tones and the test tones at an output of the microphones proximate to the listener's ears to obtain a first difference signal ΔA. The second coloration can be determined by using the microphones proximate to the ears of the dummy head to sample test tones, and measuring a difference between the actual test tones and the test tones at the output of the microphones proximate to the ears of the dummy head to obtain a second difference signal ΔB. The third coloration can be determined by playing test tones through the headphones, and measuring a difference between the actual test tones and the reproduction of the test tones by the headphones to obtain a third difference signal ΔC. The difference signals can be added together (ΔA+ΔB+ΔC) to obtain the equalization signal ΔE.

A database of equalization parameters can be maintained for use in calibrating different makes and models of headphones. More particularly, the apparatus of the invention can maintain a database containing data indicative of characterized reference microphones, characterized reference headphones, and equalization parameters indicative of the audio colorations associated with the different microphones and headphones. Means can be provided for allowing a listener to identify a particular set of headphones being used to listen to audio content, and for providing a headphone identifier in response. Means can also be provided to extract a microphone identifier from the audio content (e.g., using a watermark or other signal embedded in the audio) to identify the type of microphones used to record the audio content. In such an implementation, the processor can obtain equalization parameters from the database based on the headphone and microphone identifiers to compute the equalization signal.

The database can also contain data indicative of playback devices and equalization parameters associated with the playback devices. In such an embodiment, means can be provided for allowing the listener to identify a particular playback device being used to listen to audio content, and for providing a playback device identifier in response. The processor can then obtain equalization parameters from the database based on the playback device identifier for use in computing the equalization signal.

The processor (and associated software, database, etc.) can reside in the playback device, the user headphones, or be coupled between the playback device and the user headphones.

A further embodiment of a method is provided for calibrating user headphones to improve the accuracy of recorded audio content reproduced thereon. In this embodiment, a reference audio playback device is characterized to indicate a first audio coloration caused thereby when processing audio content for playback. Headphones of a type corresponding to the user headphones are characterized to indicate a second audio coloration caused thereby when reproducing audio content. An equalization signal ΔE is computed based on the first and second audio colorations. The equalization signal can be further computed based on a third audio coloration determined by characterizing reference microphones when recording the audio content. The equalization signal is applied to calibrate the user headphones during playback of audio content that was recorded using microphones of a type corresponding to the reference microphones and/or a playback device of a type corresponding to the reference playback device.

The method can further include determining the first coloration by using the reference playback device to process test tones, and measuring a difference between the actual test tones and the test tones at the output of the reference playback device to obtain a first difference signal ΔA. The second coloration can be determined by playing test tones through the reference headphones, and measuring a difference between the actual test tones and the reproduction of the test tones by the reference headphones to obtain a second difference signal $\Delta B$. The third coloration can be determined by using the reference microphones proximate to at least one of a dummy head and listener's ears to sample test tones, and measuring a difference between the actual test tones and the test tones at an output of the reference microphones to obtain a third difference signal $\Delta C$. The difference signals $\Delta A+\Delta B+\Delta C$ can be added together or otherwise processed to obtain the equalization signal $\Delta E$.

In order to accommodate a variety of different microphones, playback devices and headphones for use in the recording and audio reproduction processes, a database of equalization parameters can be maintained for use in calibrating different makes and models of headphones. For example, one or more databases can be maintained containing data indicative of characterized reference microphones, characterized reference playback devices, characterized reference headphones, and equalization parameters indicative of the audio colorations associated with the different microphones, playback devices and headphones. Once the databases are available, a listener can be allowed (e.g., via a graphical user interface ("GUI")) to identify a particular playback device being used to process audio content. A playback device identifier can then be provided in response to the listener's input. Similarly, the listener can be allowed to identify a particular set of headphones being used to listen to the audio content, and a headphone identifier can be provided in response thereto. A microphone identifier can be extracted from the audio content (e.g., via a watermark or the like carried in the audio content) to identify the type of microphones used to record the audio content. Equalization parameters can then be obtained from the database based on the playback device, headphone and microphone identifiers for use in computing the equalization signal.

DETAILED DESCRIPTION OF THE INVENTION

As indicated above, the present invention provides methods and apparatus for allowing audio engineers to control a listener's experience by accounting for the impacts of recording components, playback components and headphones on the accuracy of a reproduced audio signal. The goal is to recreate the experience of actually being at a live audio event at an individual user level. Parameters relating to the impact of the recording equipment, playback equipment and headphones used by the listener are maintained in a database to allow for the equalization of the listener's headphones when reproducing a particular audio performance.

Figure 1:
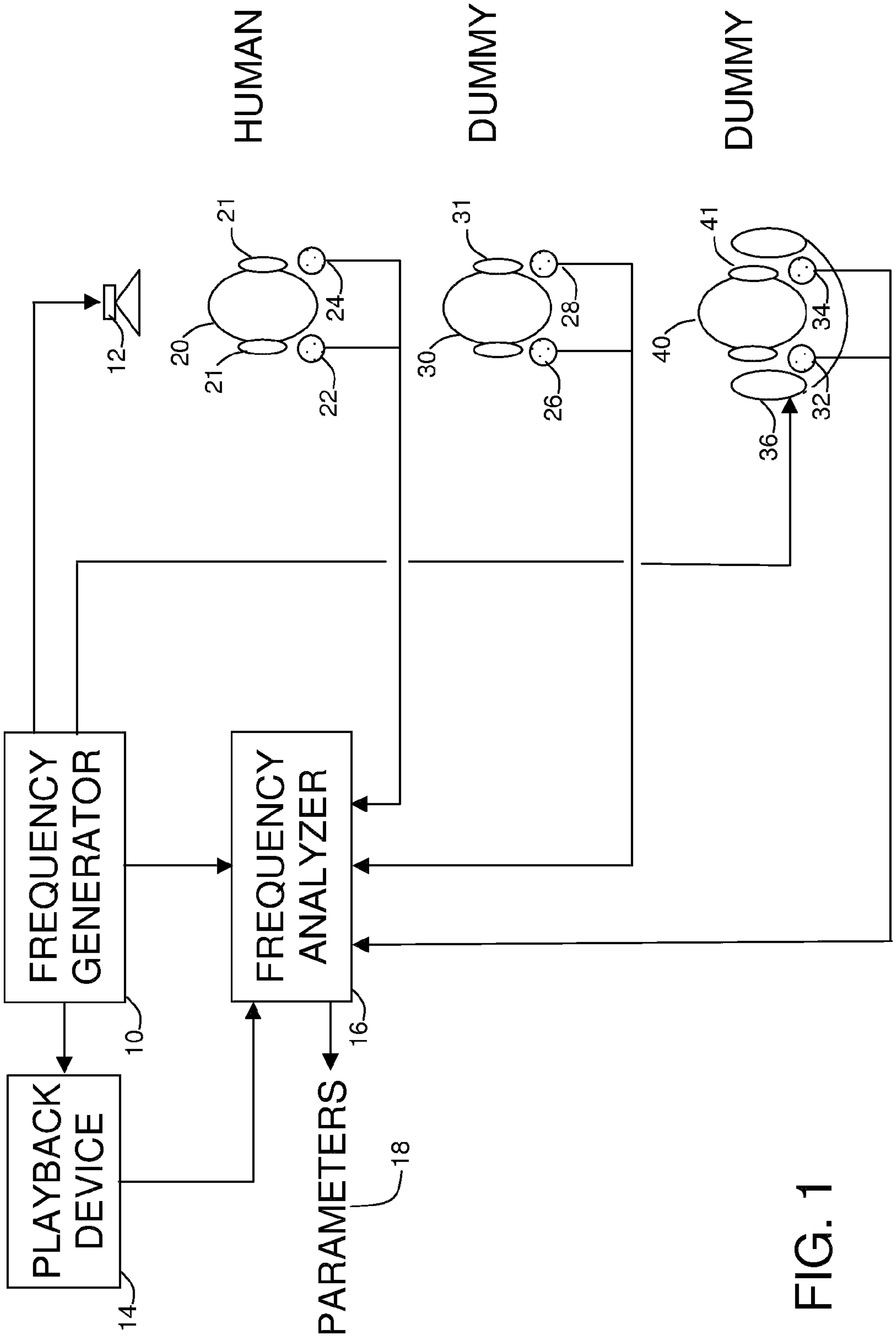
FIG. 1 is a block diagram illustrating apparatus for characterizing microphones, playback devices and headphones in accordance with the invention.

FIG. 1 illustrates an example of apparatus that can be used to characterize the microphones used to record an audio event as well as the playback device and headphones used to reproduce the recorded event for a listener. A frequency generator 10 provides tones that are used to drive a speaker 12. It is noted that a plurality of speakers can be used instead of the single speaker 12 illustrated in the figure. The tones provided are preferably pure tones (i.e., signal frequency) that are provided under the control of an audio engineer.

In order to characterize the recording microphones, the microphones can be placed in proximity to (e.g., adjacent) the ears 21 of a human listener 20 and/or the ears 31 of a dummy head 30. The human and/or dummy heads are placed in a position where they will "hear" the test tones from the speaker 12. For example, microphones 22, 24 can be characterized by playing test tones from frequency generator 10 through speaker 12, and using a frequency analyzer 16 coupled to the outputs of the microphones to determine the difference between the actual test tones received from the frequency generator to the tones "heard" by the microphones 22, 24. The difference signal $\Delta A$ is output from the frequency generator 16 as a set of parameters 18 that are stored in a database for later use. Different models and types of microphones can be characterized in this way, with parameters for each being provided by the frequency analyzer and stored in the database.

Ideally, the difference signal $\Delta A$ will comprise parameters for a range of frequencies throughout the human hearing range of about 20 Hz to 20,000 Hz (20 KHz). The frequency generator can provide this range of tones to the speaker 12 as discrete tones, one after the other, or as a continuous frequency sweep for analysis by the frequency analyzer 16.

The same or similar microphones 26, 28 can be characterized in proximity to the ears 31 of dummy head 30 in the same manner. The reason for characterizing the recording microphones at both a human head and a dummy head is that there will be subtle differences in the response of the microphones depending on whether they are used adjacent a human's ears or the ears of a dummy. By providing parameters for the audio colorations caused by the microphones in both environments, a more accurate calibration of a listener's headphones can be achieved. Like the characterization of the microphones 22, 24 proximate a human's ears, the parameters for a difference signal $\Delta B$ resulting from the microphones 26, 28 adjacent the dummy's ears can be stored in a database for later use in calibrating the headphones of the ultimate listener. Different models and types of microphones can be characterized in this way, with parameters for each being provided by the frequency analyzer and stored in the database.

A further difference signal $\Delta C$ is computed to characterize the type of headphones used by the ultimate listener of the audio content. In particular, a set of reference headphones 36 of a particular model receives the test tones directly from the frequency generator 10. The headphones can be any style, including over the ear, in ear, ear buds, etc. The headphones 36 are placed over or in the ears 41 of a dummy head 40. A pair of microphones 32, 34 is placed adjacent the dummy's ears in a position to "hear" the test tones from the reference headphones 36. The outputs of the microphones are coupled to frequency analyzer 16, which computes $\Delta C$ by determining the difference between the actual test tones and the test tones as reproduced by the headphones. A set of parameters representing this difference (the "audio coloration" caused by the headphones) is provided by the frequency analyzer and stored in a database for use in computing an equalization signal to calibrate the actual headphones used by the ultimate listener. Different models and types of headphones can be characterized in this way, with parameters for each being provided by the frequency analyzer and stored in the database.

A playback device (e.g., mp3 player, smart phone or the like) can also be characterized in accordance with the invention and used in the calibration of the ultimate listener's headphones to provide more accurate reproduction of the audio content. As shown in FIG. 1, a playback device 14 receives the test tones directly from the frequency generator 10, e.g., via an input jack, a USB connection or the like. The test tones are "played back" by the playback device and output to the frequency analyzer 16. Parameters 18 are provided by the frequency analyzer representing the difference AD between the actual test tones and the test tones output from the playback device (the "audio coloration" added by the playback device). Different models and types of playback devices can be characterized in this way, with parameters for each being provided by the frequency analyzer and stored in the database.

Figure 2:
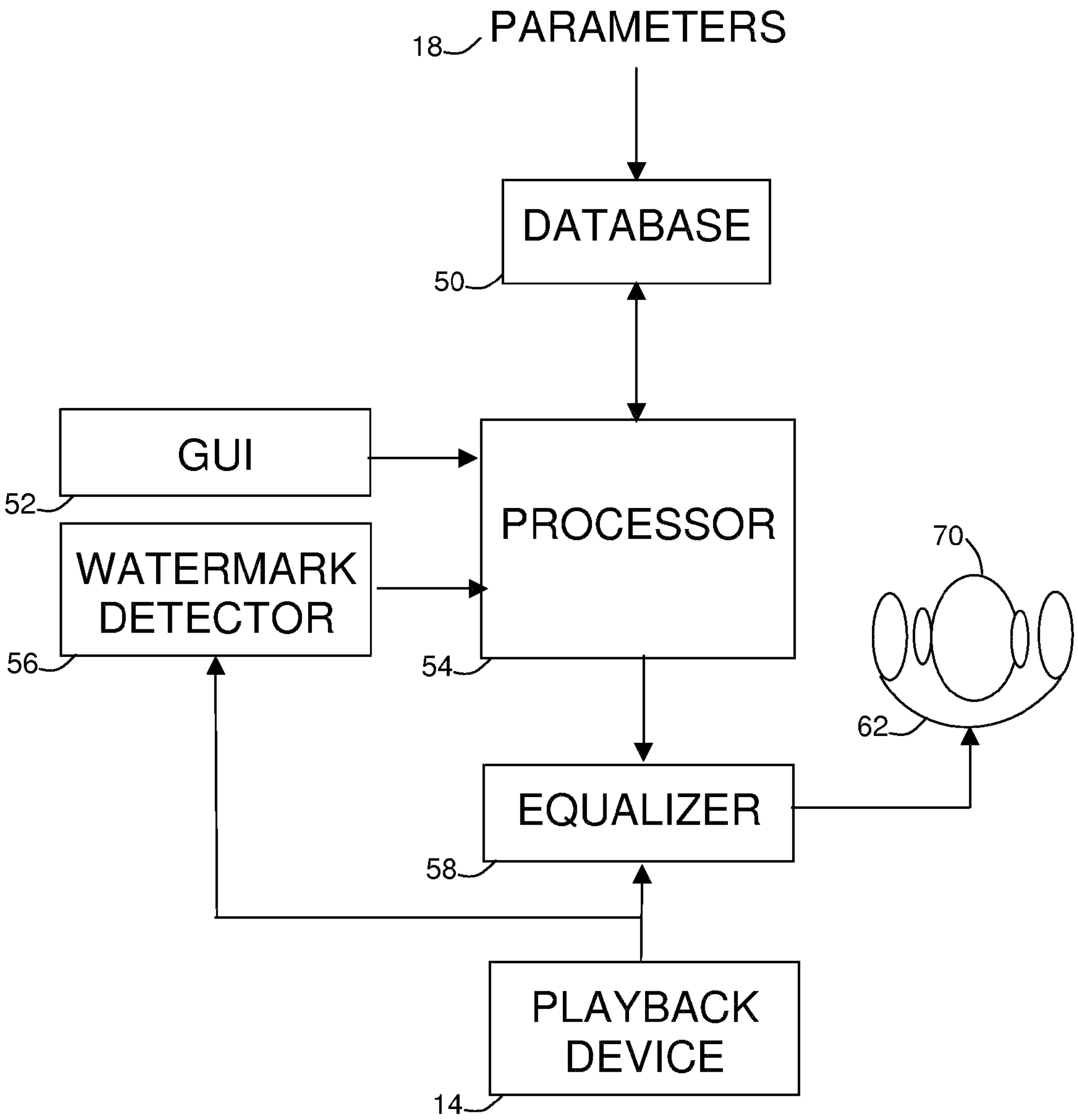
FIG. 2 is a block diagram illustrating apparatus for calibrating headphones in accordance with the invention.

FIG. 2 illustrates an example embodiment of hardware and/or software components that be used to calibrate the ultimate listener's headphones. The parameters 18 from the frequency analyzer 16 (FIG. 1) are stored in a database 50. These parameters can include the audio coloration added by the reference microphones 22, 24 and/or 26, 28, the audio coloration added by the reference headphones 36, and the audio coloration added by the playback device 14. Moreover, as noted above, the database may store audio coloration data (e.g., difference signal data) for many different types and models of reference microphones, reference headphones and reference playback devices that correspond to those used in the actual recording and listening sessions.

A processor 54 uses audio coloration data from database 50 to compute an equalization signal for calibrating the listener's headphones. In order to do this, the processor must know what type of microphones were used to record the audio content for which the headphones are being calibrated, what type of playback device is being used by the listener, and what type of headphones are being used by the listener (and are to be calibrated). An interface, such as a graphical user interface (GUI) 52 is provided to allow the listener to identify to the processor what type and/or model of playback device and what type and/or model of headphones are being used. With this information, the processor 54 can extract the proper parameters 18 from the database 50 that relate to these particular playback device and headphones. Additional parameters, such as crosstalk, can also be maintained and incorporated into the equalization signal for use in the calibration process provided by the inventive system.

The listener will probably not know the particular type and model of microphones that were used to record the audio content. If this information is known, it can be entered by the listener via the GUI 52. If this information is not known, it can be embedded in the audio content, e.g., by way of an inaudible watermark in the audio signal. A watermark detector 56 can be provided to allow the watermark to be extracted from the audio signal and passed on to the processor 54. The processor uses the information contained in the watermark to extract the proper parameters 18 from the database 50 that relate to the particular microphones used in the recording of the audio. As indicated in FIG. 2, the audio signal is provided to the watermark detector 56 from the playback device 14

Once the processor 54 has all of the necessary parameters, it computes an equalization signal $\Delta E$ for use in controlling an equalizer 58 to provide a calibrated audio content signal to the user headphones 62 being used by the listener 70. The equalization signal can simply be the sum of the audio colorations $\Delta A+\Delta B+\Delta C+\Delta D$, or it may be the result of a more sophisticated formulation. Once the equalization signal has been computed, it is provided to the equalizer 58 which applies the signal to the headphones 62, e.g., by adding or subtracting the equalization signal to/from the output of the playback device 14. The resultant audio output signal, which has been calibrated by application of the equalization signal, is reproduced for the listener 70 by headphones 62 to provide an audio output with improved accuracy.

As will be appreciated by those skilled in the art, the point of applying the equalization signal is to appropriately modify the output signal from the playback device in order to improve the accuracy of the audio reproduction. The particular way in which the equalization signal is applied, such as subtracting the EQ signal from the output signal, adding the EQ signal to the output signal, or otherwise mixing the two signals together will depend on the nature of the EQ signal itself. For example, where the EQ signal consists of the sum of the audio colorations added by the recording microphones, the playback device and the headphones, the EQ signal can be inverted and added back to the output signal to provide the calibrated signal for input to the user's headphones.

The database, GUI, watermark detector, processor and equalizer components illustrated in FIG. 2 can be implemented in software and/or hardware as will be appreciated by those skilled in the art. These components can be part of the headphones, or provided in a standalone unit coupled between the playback device and the headphones, or can be part of the playback device. For example, where the playback device is a smart phone or the like, these components can be implemented via an "app" that is run on the playback device. Alternatively, some or all of the components can be hardwired into the playback device. Other implementation variations will be apparent to those skilled in the art. In a preferred embodiment, these components are able to be updated, e.g., via download from the Internet.

Figure 3:
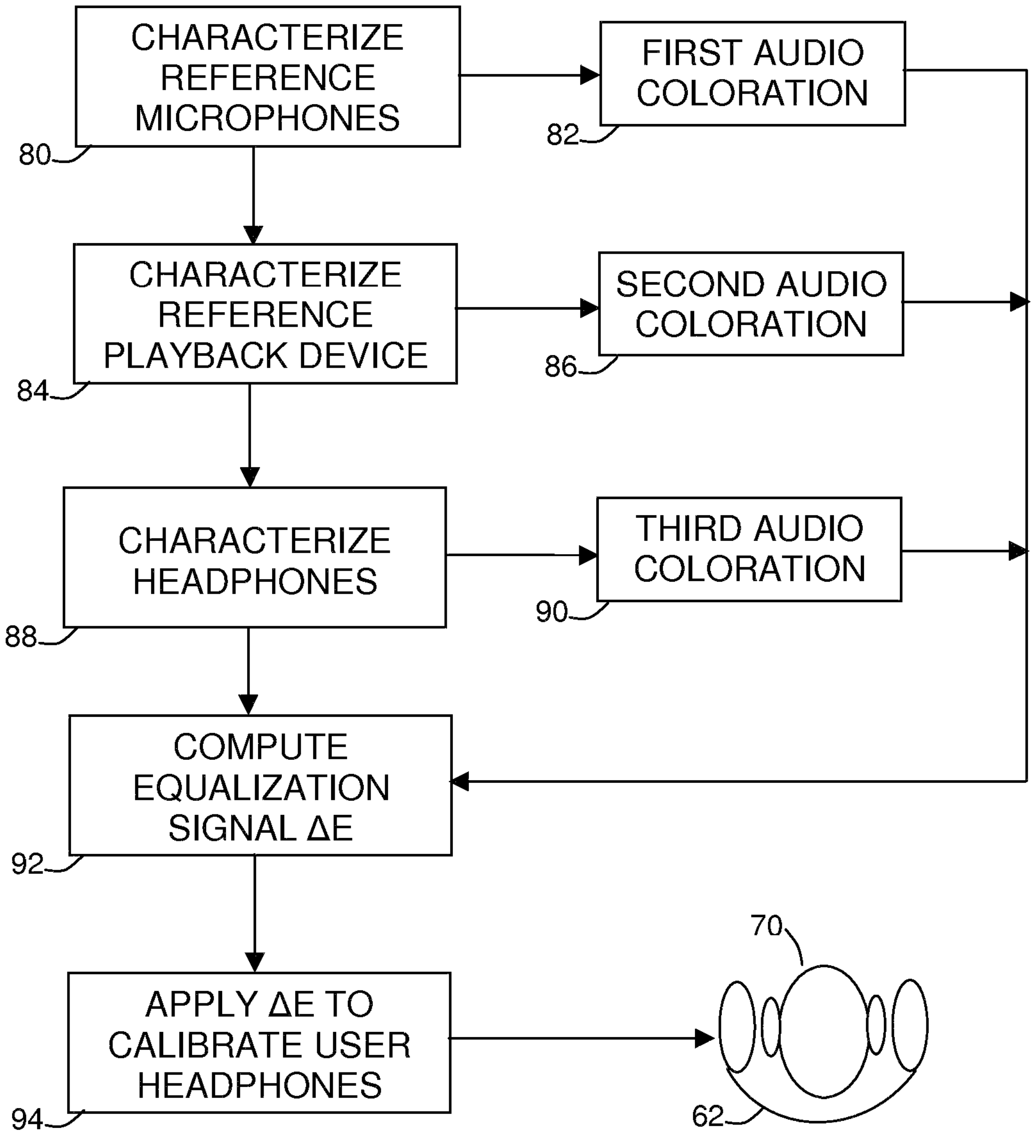
FIG. 3 is a flow chart illustrating steps of one possible implementation of a method in accordance with the invention.

FIG. 3 is a flowchart illustrating an implementation of a method for calibrating headphones in accordance with the invention. At box 80, reference microphones (and preferably their orientation and recording characteristics to the extent they can be measured) are characterized to determine a first audio coloration 82 that is expected to be introduced by the microphones during a recording session. As indicated above, the reference microphones may be characterized based on their use on a human listener's head, on a dummy head, or both. It should be appreciated that it would also be possible to characterize the reference microphones without being in proximity to either a human or dummy head, but solely based on their response in air. At box 84, a reference playback device is characterized to determine a second audio coloration 86 that is expected to be introduced by the same make and model of playback device used by a listener. At box 88, reference headphones are characterized to determine a third audio coloration 90 that is expected to be introduced by the same make and model of headphones used by the listener.

Each of the audio colorations 82, 86 and 90 is provided to box 92 for the computation of an equalization signal $\Delta E$. The equalization signal is then applied to calibrate the user headphones 62, as indicated at box 94. Upon calibration, the headphones will provide more accurate audio content to the listener 70, which will better recreate the acoustic environment of the actual event (e.g., live concert) where the audio was recorded.

Any number of different microphones, playback devices and headphones can be characterized using the invention. Ideally, virtually all such devices available in the marketplace will be characterized and stored in a database so that any recording can be processed in accordance with the invention. The recording itself can carry information (e.g., in an inaudible watermark) identifying the microphones used for the recording, while the playback device and user headphones can be identified by the listener via a GUI or the like as described above. Once the microphones, playback device and headphones have been identified, their parameters (e.g., the audio colorations associated therewith) can be extracted from the database and used to compute the equalization signal that will be applied to the audio output of the playback device to compensate for the audio colorations.

It should now be appreciated that the present invention provides a closed loop recording and playback system, designed to recreate the acoustic environment of a listener at a audio event, when the audio event is recorded and played back through headphones. The invention ties together the recording technology and the playback mechanisms used by a listener to eliminate as many variables as possible that exist in the multitude of user choices, by building databases of (i) recording techniques and their effect upon the original acoustic environment, (ii) the playback mechanism selected by the user and its potential changes to the playback signal, and (iii) the headphone brand and model (e.g., SKU) used by the listener and the changes caused by the headphones to the playback signal. By identifying, cataloging, and adjusting for all of these impacts upon the acoustics of the original event, the inventive system can be utilized by a consumer, who simply identifies the playback device and headphones being used.

In accordance with the invention, recordings will be made of events using various and changing technologies that best simulate what a human might experience if present at the event. As technology improves over time, these recordings will be made to sound more and more like the original environment, and the characteristics of each recording will be maintained in a database. When played back, the inventive system, which may include software and/or hardware, will recognize which recording process was used (e.g., through the use of a silent tone or other electronic signal that is coded in the recording) so that the recording is adjusted before playback to account for known changes. The individual listener identifies the particular playback device and headphones, upon which the system will adjust the recording further to account for those variables. The result is to recreate the original acoustic environment as nearly as possible for the individual listener, regardless of original recording technique, playback device, or headphones employed. Through the use of three distinct databases of known and measurable impacts of the recording device, the playback device and the headphone device, the inventive system will account for all measurable changes to the original acoustic event, and calibrate for the individual listener's playback experience. This "closed loop" process will, for the first time, tie together audio recording and individual playback, such that one set of audio engineers can control the quality and acoustic experience of the individual listener, regardless of the playback hardware/software and regardless of when a recording is made and what technology was used.

It is noted that new implementations of the invention can always use the then current state of the art recording and playback techniques to capture the differences, to the extent allowed by the technology at the time, between the audio reproduction devices used and how a human listener would perceive the event live. By building a database over time of the measurable differences between the specific recording technology used for a particular recording and a human perception of the live event, a user will be able to listen to both older and newer recordings, with the differences in technology at the time the recordings were made being accounted for. Software can be provided in the playback device that recognizes which technology was used during the recording of audio content (e.g., via a watermark or the like), and to switch the equalization accordingly to best calibrate the user's headphones for the particular content being listened to at the time.

Although the invention has been described in accordance with a particular example embodiment, those skilled in the art will appreciate that various other embodiments, variations and modifications can be provided using the teachings of the invention, all of which are intended to be included within the scope of the following claims.

What is claimed is:

1. A method for calibrating user headphones to improve the accuracy of recorded audio content reproduced thereon, comprising:

determining characterizing of reference microphones of a type used to record said audio content to indicate a first audio coloration caused by the microphones when located proximate to a listener's ears;

determining characteristics of said microphones to indicate a second audio coloration caused thereby when located proximate to the ears of a dummy head;

determining characteristics of reference headphones of a type corresponding to said user headphones to indicate a third audio coloration caused by the reference headphones when used to reproduce audio content;

computing an equalization signal $\Delta E$ based on the first, second and third audio colorations; and applying the equalization signal to calibrate said user headphones during playback of audio content that was recorded using microphones of a type corresponding to said reference microphones.

2. The method of claim 1 comprising:

determining said first coloration by using the microphones proximate to said listener's ears to sample test tones, and measuring a difference between the actual test tones and the test tones at an output of said microphones proximate to the listener's ears to obtain a first difference signal $\Delta A$;

determining said second coloration by using the microphones proximate to the ears of said dummy head to sample test tones, and measuring a difference between the actual test tones and the test tones at the output of said microphones proximate to the ears of said dummy head to obtain a second difference signal $\Delta B$; and determining said third coloration by playing test tones through said headphones, and measuring a difference between the actual test tones and the reproduction of the test tones by said headphones to obtain a third difference signal $\Delta C$.

3. The method of claim 2 comprising:

adding $\Delta A+\Delta B+\Delta C$ to obtain said equalization signal $\Delta E$.

4. The method of claim 3 comprising:

maintaining a database of equalization parameters indicative of said audio colorations for use in computing equalization signals to calibrate different makes and models of headphones.

5. The method of claim 1 comprising:

maintaining a database of characterized reference microphones;

maintaining a database of characterized reference headphones;

maintaining a database of equalization parameters associated with the different microphones and headphones, said equalization parameters being indicative of said audio colorations;

allowing a listener to identify a particular set of headphones being used to listen to audio content, and providing a headphone identifier in response thereto;

extracting a microphone identifier from said audio content to identify the type of microphones used to record the audio content; and retrieving equalization parameters from said database in response to said headphone identifier and said microphone identifier for use in computing equalization signals to calibrate the listener's headphones.

6. The method of claim 5 comprising:

maintaining a database of playback devices;

maintaining a database of equalization parameters associated with said playback devices;

allowing said listener to identify a particular playback device being used to listen to audio content, and providing a playback device identifier in response thereto;

retrieving an equalization parameter from said database in response to said playback device identifier and incorporating said equalization parameter into said equalization signal for use in calibrating the listener's headphones.

7. Apparatus for calibrating user headphones to improve the accuracy of recorded audio content reproduced thereon, comprising:

means for determining characteristics of reference microphones to indicate a first audio coloration caused thereby;

means for determining characteristics of a reference audio playback device to indicate a second audio coloration caused thereby;

means for determining characteristics of reference headphones of a type corresponding to said user headphones to indicate a third audio coloration caused thereby;

a processor coupled to receive parameters indicative of the first, second and third audio colorations, and to compute an equalization signal $\Delta E$ based on said colorations; and means for applying the equalization signal to calibrate said user headphones during playback of audio content that was recorded using microphones of a type corresponding to said reference microphones and a playback device of a type corresponding to said reference playback device.

8. The apparatus of claim 7 comprising:

means for determining said first coloration by using the reference microphones proximate to at least one of a dummy head and listener's ears to sample test tones, and measuring a difference between the actual test tones and the test tones at an output of said reference microphones to obtain a first difference signal $\Delta A$;

means for determining said second coloration by using the reference playback device to process test tones, and measuring a difference between the actual test tones and the test tones at the output of said reference playback device to obtain a second difference signal $\Delta B$; and means for determining said third coloration by playing test tones through said reference headphones, and measuring a difference between the actual test tones and the reproduction of the test tones by said reference headphones to obtain a third difference signal $\Delta C$.

9. The apparatus of claim 8 comprising:

means for adding $\Delta A+\Delta B+\Delta C$ to obtain said equalization signal $\Delta E$.

10. The apparatus of claim 9 comprising:

a database of equalization parameters for use in calibrating different makes and models of headphones.

11. The apparatus of claim 7 comprising:

a database containing data indicative of characterized reference microphones, characterized reference playback devices, characterized reference headphones, and equalization parameters indicative of said audio colorations associated with the different microphones, playback devices and headphones;

means for allowing a listener to identify a particular playback device being used to process audio content, and providing a playback device identifier in response thereto;

means for allowing a listener to identify a particular set of headphones being used to listen to said audio content, and providing a headphone identifier in response thereto; and means for extracting a microphone identifier from said audio content to identify the type of microphones used to record the audio content;

wherein said processor obtains equalization parameters from said database based on the playback device, headphone and microphone identifiers to compute said equalization signal.

12. The apparatus of claim 11 wherein said processor resides in said playback device.

13. The apparatus of claim 11 wherein said processor is coupled between said playback device and said user headphones.

14. The apparatus of claim 11 wherein said processor resides in said user headphones.

15. A method for calibrating user headphones to improve the accuracy of recorded audio content reproduced thereon, comprising:

determining characteristics of a reference audio playback device to indicate a first audio coloration caused thereby when processing audio content for playback;

determining characteristics of headphones of a type corresponding to said user headphones to indicate a second audio coloration caused thereby when reproducing audio content;

determining characteristics of reference microphones to indicate a third audio coloration caused thereby when recording audio content;

computing an equalization signal $\Delta E$ based on the first, second, and third audio colorations;

applying the equalization signal to calibrate said user headphones during at least one of: playback of audio content on a playback device of a type corresponding to said reference playback device; and playback of audio content that was recorded using microphones of a type corresponding to said reference microphones;

wherein:

said first coloration is determined by using the reference playback device to process test tones, and measuring a difference between the actual test tones and the test tones at the output of said reference playback device to obtain a first difference signal $\Delta A$;

said second coloration is determined by playing test tones through said reference headphones, and measuring a difference between the actual test tones and the reproduction of the test tones by said reference headphones to obtain a second difference signal $\Delta B$; and said third coloration is determined by using the reference microphones proximate to at least one of a dummy head and listener's ears to sample test tones, and measuring a difference between the actual test tones and the test tones at an output of said reference microphones to obtain a third difference signal $\Delta C$.

16. The method of claim 15 comprising;

adding $\Delta A+\Delta B+\Delta C$ to obtain said equalization signal $\Delta E$.

17. The method of claim 15 comprising:

maintaining a database containing data indicative of characterized reference microphones, characterized reference playback devices, characterized reference headphones, and equalization parameters indicative of said audio colorations associated with the different microphones, playback devices and headphones;

allowing a listener to identify a particular playback device being used to process audio content, and providing a playback device identifier in response thereto;

allowing a listener to identify a particular set of headphones being used to listen to said audio content, and providing a headphone identifier in response thereto; and extracting a microphone identifier from said audio content to identify the type of microphones used to record the audio content;

wherein equalization parameters are obtained from said database based on the playback device, headphone and microphone identifiers for use in computing said equalization signal.

18. The method of claim 15 comprising:

maintaining a database of equalization parameters for use in calibrating different makes and models of headphones.

* * * * *